(12) United States Patent
Leypold et al.

(10) Patent No.: US 10,181,392 B2
(45) Date of Patent: Jan. 15, 2019

(54) MONITORING A DISCHARGE IN A PLASMA PROCESS

(71) Applicant: TRUMPF Huettinger GmbH + Co. KG, Freiburg (DE)

(72) Inventors: Daniel Leypold, Freiburg (DE); Ulrich Richter, Freiburg (DE); Fabian Wunn, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 15/088,629

(22) Filed: Apr. 1, 2016

(65) Prior Publication Data

US 2016/0217975 A1    Jul. 28, 2016

Related U.S. Application Data

(63) Continuation of application No. PCT/EP2014/070856, filed on Sep. 30, 2014.

(30) Foreign Application Priority Data

Oct. 1, 2013   (DE) .................. 10 2013 110 883

(51) Int. Cl.
*H01J 37/32*     (2006.01)
*G01R 19/00*     (2006.01)
*G01R 31/12*     (2006.01)

(52) U.S. Cl.
CPC .... *H01J 37/32009* (2013.01); *G01R 19/0061* (2013.01); *G01R 31/12* (2013.01);
(Continued)

(58) Field of Classification Search
CPC .............. G01R 19/0061; G01R 31/12; H01J 37/32009; H01J 37/32917; H01J 37/32926; H01J 37/32935; H01J 37/32944
See application file for complete search history.

(56) References Cited

U.S. PATENT DOCUMENTS 4,694,402 A * 9/1987 McEachern ............ G01R 19/25
324/102
5,389,154 A * 2/1995 Hiroshi ............. H01J 37/32192
118/723 ME
(Continued)

FOREIGN PATENT DOCUMENTS

CN      1856859 A     11/2006
CN      1987490 A      6/2007
(Continued)

OTHER PUBLICATIONS

International Search Report from corresponding PCT Application No. PCT/EP2014/070856, dated Dec. 15, 2014, 6 pages.
(Continued)

*Primary Examiner* — Alexander H Taningco
*Assistant Examiner* — Kurtis R Bahr
(74) *Attorney, Agent, or Firm* — Fish & Richardson P.C.

(57) ABSTRACT

Devices and methods for monitoring a discharge in a plasma process are provided. An example method includes detecting at least a first signal path of at least one plasma supply signal within at least a first time range within at least one period of the plasma supply signal, detecting at least a second signal path of the at least one plasma supply signal within at least a second time range which is at the point corresponding to the first time range in at least one other period of the plasma supply signal, and generating an identification signal if the second signal path deviates by at least a distance from the first signal path. The distance has a minimum time difference and a minimum signal amplitude difference. The method enables to identify arcs in a very reliable and very rapid manner.

24 Claims, 10 Drawing Sheets

(52) U.S. Cl.
CPC .. *H01J 37/32917* (2013.01); *H01J 37/32926* (2013.01); *H01J 37/32935* (2013.01); *H01J 37/32944* (2013.01)

(56) References Cited

U.S. PATENT DOCUMENTS

| | | | |
|---|---|---|---|
| 5,415,757 A | 5/1995 | Szcyrbowski et al. | |
| 5,611,899 A | 3/1997 | Maass | |
| 5,698,082 A | 12/1997 | Teschner et al. | |
| 6,420,863 B1 | 7/2002 | Milde et al. | |
| 6,736,944 B2 | 5/2004 | Buda | |
| 7,262,606 B2 | 8/2007 | Axenbeck et al. | |
| 7,292,045 B2 | 11/2007 | Anwar et al. | |
| 7,305,311 B2 | 12/2007 | van Zyl | |
| 7,695,599 B2 | 4/2010 | Kuriyama et al. | |
| 8,456,220 B2 * | 6/2013 | Thome | H01J 37/32 327/419 |
| 9,062,377 B2 | 6/2015 | Levay | |
| 9,070,537 B2 | 6/2015 | Yuzurihara | |
| 9,131,543 B2 * | 9/2015 | Ben-Shmuel | H05B 6/72 |
| 9,167,633 B2 * | 10/2015 | Ben-Shmuel | H05B 6/6402 |
| 9,305,751 B2 * | 4/2016 | Kaneko | H01J 37/32266 |
| 9,313,870 B2 | 4/2016 | Walde | |
| 9,613,784 B2 | 4/2017 | Klein | |
| 9,685,297 B2 | 6/2017 | Carter | |
| 2002/0195330 A1 * | 12/2002 | Agamohamadi | A61L 2/14 204/164 |
| 2005/0051270 A1 | 3/2005 | Sasaki et al. | |
| 2005/0093459 A1 | 5/2005 | Kishinevsky | |
| 2006/0021980 A1 * | 2/2006 | Lee | A61L 2/14 219/747 |
| 2006/0049831 A1 | 3/2006 | Anwar et al. | |
| 2006/0137613 A1 * | 6/2006 | Kasai | H01J 37/32192 118/723 MW |
| 2006/0213761 A1 | 9/2006 | Axenbeck et al. | |
| 2006/0241879 A1 | 10/2006 | van Zyl | |
| 2007/0073498 A1 | 3/2007 | Winterhalter et al. | |
| 2007/0168143 A1 | 7/2007 | Axenbeck et al. | |
| 2008/0216745 A1 | 9/2008 | Wiedemuth et al. | |
| 2010/0176121 A1 * | 7/2010 | Nobue | H05B 6/686 219/716 |
| 2010/0231194 A1 | 9/2010 | Bauch et al. | |
| 2012/0000765 A1 | 1/2012 | Halloran | |
| 2012/0043890 A1 | 2/2012 | Larson et al. | |
| 2012/0146509 A1 | 6/2012 | Hermanns | |
| 2013/0221847 A1 | 8/2013 | Choi | |
| 2015/0048862 A1 | 2/2015 | Na | |
| 2016/0093471 A1 | 3/2016 | McChesney | |
| 2016/0237554 A1 | 8/2016 | Kadlec | |
| 2016/0343549 A1 | 11/2016 | Gieraltowski | |
| 2017/0178879 A1 | 6/2017 | Klein | |
| 2017/0278665 A1 | 9/2017 | Carter | |
| 2017/0287684 A1 | 10/2017 | Gapinski | |
| 2017/0330737 A1 | 11/2017 | Zelechowski | |

FOREIGN PATENT DOCUMENTS

| | | | |
|---|---|---|---|
| CN | 103474321 A | 12/2013 | |
| DE | 4326100 A1 | 2/1995 | |
| DE | 4420951 | 12/1995 | |
| DE | 4450951 A1 | 12/1995 | |
| DE | 19848636 A1 | 5/2000 | |
| DE | 102008062949 A1 | 6/2010 | |
| DE | 102009011960 A1 | 9/2010 | |
| DE | 102013110883 B3 | 1/2015 | |
| EP | 1705687 A1 | 9/2006 | |
| EP | 1720195 A1 | 11/2006 | |
| EP | 1801946 A1 | 6/2007 | |
| JP | 2004323902 A | 11/2004 | |
| JP | 2004327193 A | 11/2004 | |
| JP | 2007-173244 | 7/2007 | ............... H05H 1/00 |
| JP | 2007-186724 | 7/2007 | |
| JP | 2007-186725 | 7/2007 | ............. C23C 14/34 |
| JP | 2007-214254 | 8/2007 | ......... H01L 21/3065 |
| JP | 2007-531210 | 11/2007 | ............... H05H 1/00 |
| JP | 2008-206372 | 9/2008 | |
| KR | 100483905 B1 | 4/2005 | |
| KR | 20110012055 A | 2/2011 | |
| TW | 201014148 | 4/2010 | |
| TW | I326462 | 6/2010 | |
| WO | WO2008150136 A1 | 12/2008 | |
| WO | WO2011073093 A1 | 6/2011 | |
| WO | WO2015049213 A1 | 4/2015 | |

OTHER PUBLICATIONS

Ochs et al., "Comparison of Mid Frequency and Bipolar Pulsed DC Power Supplies for Dual Magnetron Sputtering", Society of Vacuum Coaters, 51$^{st}$ Annual Technical Conference Proceedings, Chicago, IL, Apr. 19-24, 2008, 4 pages.

Wikipedia, "Successive approximation ADC", Creative Commons Attribution-Share-Alike License, last modified on Jul. 6, 2013, 4 pages.

Japanese Notice of Allowance for Japanese Application Serial No. 2016-519776 dated Mar. 26, 2018.

Office Action in Taiwan Application No. 103134065, dated Jul. 3, 2018, 20 pages. (with English translation).

* cited by examiner

MONITORING A DISCHARGE IN A PLASMA PROCESS

CROSS-REFERENCE TO RELATED APPLICATIONS

This application is a continuation of and claims priority under 35 U.S.C. § 120 to PCT Application No. PCT/EP2014/070856 filed on Sep. 30, 2014, which claims priority to German Application No. DE 10 2013 110 883.0, filed on Oct. 1, 2013. The contents of both of these priority applications are hereby incorporated by reference in their entireties.

TECHNICAL FIELD

The invention relates to monitoring a discharge in a plasma process, in particular between electrodes of a cathode sputtering arrangement, to which power is supplied by a power generator with a periodically changing output signal of the power generator.

BACKGROUND

The coating of substrates, for example, glass faces, by means of cathode sputtering in plasma processes, both in a reactive manner and in a conventional manner, is, for example, known from architectural glass coating. To that end, a plasma which carries material away from a target which is deposited on the substrate, for example, the glass pane, is produced with a current or voltage source. Before the deposit, the atoms can still become connected to gas atoms or molecules in a reactive process in accordance with the desired coating.

In particular in reactive processes, mid-frequency generators (MF generators) which generally operate at a frequency of from 10 to 500 kHz are often used. There are also known pulsed generators, in particular bipolar-pulsed generators. All those generators are included with the term power generator with a periodically changing output signal of the power generator for power supply. The output voltage of those generators is often directed with two electrodes in a plasma process chamber which alternately operate as a cathode and anode and which are both connected to a respective target. There are so-called free-running generators or generators which operate with a controlled frequency. In particular in reactive processes, flashovers which are often extinguished by themselves with the next voltage reversal or at least after a few periods, so-called micro-arcs, are also produced in those generators. However, more energetic and longer-lasting flashovers, so-called arcs, may also occur. It is important to identify such arcs safely, reliably and rapidly. Often, arcs are identified by checking the output voltage for a voltage breakdown or by checking the output current for a voltage increase. Alternatively, an arc may be identified by the difference between the currents to the individual electrodes. A limit value for identifying arcs may be adjusted by the operator. A problem is that, for a periodically changing output signal of the power generator, it is not possible to establish a fixed value for a voltage breakdown or current increase because the current and voltage are intended to change continuously as a matter of principle. In the past, different methods have been developed for identification. In one method, the effective value of the current and voltage is established. Since such an establishment has to be carried out over a plurality of periods, this type of identification of an arc is generally substantially too slow and is often in the region of a few hundred milliseconds.

When the generators are used in the semiconductor production process, in particular flat panel display (FPD) production, however, increased requirements are placed on the generators. Here, arcs are intended to be identified within a few microseconds or even less than one microsecond.

EP1801946 A1 discloses a method for identifying arcs in which there are determined time ranges within which an evaluation signal exceeds or falls below reference values. That step is repeated in a subsequent half-wave of the same polarity. An arc is identified if corresponding time ranges differ by more than a predetermined tolerance. In this method, a plurality of reference values have to be provided for reliable identification of arcs and a plurality of tolerances have to be set for each reference value, which is complex. This method may also result in erroneously identified arcs in the case of a very high number of reference values and very well-adjusted tolerances.

SUMMARY

Devices, methods, and systems for monitoring a discharge in a plasma process, in particular between electrodes of a cathode sputtering arrangement, to which a power generator supplies power with a periodically changing output signal of the power generator, are provided.

One aspect of the invention features a monitoring device for monitoring a discharge in a plasma process. The monitoring device has:

a. a signal detection device for detecting at least a first signal path of at least one plasma supply signal within at least a first time range within at least one period of the plasma supply signal, b. a signal detection device for detecting at least a second signal path of at least one plasma supply signal within at least a second time range which is at the point corresponding to the first time range in at least one other period of the plasma supply signal, and c. an identification signal generation device which is configured to generate an identification signal if the second signal path deviates by at least a distance from the first signal path. The identification signal generation device has a distance establishment device which is configured to establish the distance by means of combining a minimum time difference and minimum signal amplitude difference.

Another aspect of the invention features another monitoring device that has an identification signal generation device which is configured to establish a threshold value line from the first signal path by means of a threshold value line establishment device and to generate an identification signal when the threshold value line is reached by the second signal path. The threshold value line establishment device is configured to add both a minimum time difference and a minimum signal amplitude difference to the first signal path in order to establish the threshold value line.

Another aspect of the invention features a method of monitoring a discharge in a plasma process. The method includes:

a. detecting at least a first signal path of at least one plasma supply signal within at least a first time range within at least one period of the plasma supply signal, b. detecting at least a second signal path of at least one plasma supply signal within at least a second time range which is at the point corresponding to the first time range in at least one other period of the plasma supply signal, c. generating an identification signal if the second signal path deviates by at least a distance from the first signal path, where the distance has a minimum time difference and a minimum signal amplitude difference.

The distance may have a minimum time difference and a minimum signal amplitude difference at any time of the second and/or first signal path.

The predeterminable distance can be established by a minimum time difference and a minimum signal amplitude difference being provided, in particular by a minimum time difference and a minimum signal amplitude difference being added to the first signal path.

Another aspect of the invention features another method of monitoring a discharge in a plasma process. The method includes:

a. detecting at least a first signal path of at least one plasma supply signal within at least a first time range within at least one period of the plasma supply signal, b. detecting at least a second signal path of at least one plasma supply signal within at least a second time range which is at the point corresponding to the first time range in at least one other period of the plasma supply signal, c. establishing a threshold value line from the first signal path, d. generating an identification signal if the second signal path reaches the threshold value line, where the threshold value line is established by using both a minimum time difference and a minimum signal amplitude difference.

The threshold value line can be established by one of: adding the minimum time difference and the minimum signal amplitude difference to the first signal path, and subtracting the minimum time difference and the minimum signal amplitude difference from the first signal path.

The distance may be a predeterminable distance. In particular, the monitoring device may have an input interface for specifying the minimum time difference and the minimum signal amplitude difference.

Alternatively or additionally, the monitoring device may have an input interface for specifying a value for establishing a flowing interval, e.g., a constant minimum distance. That value may be, for example, the sum comprising the square of the minimum time difference and the square of the minimum signal amplitude difference. In particular the value can be calculated by the square root also further being formed from the sum. The flowing interval can then be established by means of that value and a calculation rule. The calculation rule could be: establish at a point of the first signal line the pitch and mark the value perpendicularly relative to that pitch and thus establish a distance or a point of the threshold value line. Alternatively, the calculation rule could be: establish at a point of the second signal line the pitch and mark the value perpendicularly relative to that pitch and thus establish a distance. Repeat the calculation rule for each selected additional point.

The monitoring device may have preset values for the minimum time difference and/or the minimum signal amplitude difference and/or the value and may in particular have preset values for the minimum time difference and/or the minimum signal amplitude difference for different plasma process steps.

The monitoring device may also have automatic tracking of the minimum time difference and/or the minimum signal amplitude difference and/or the value in accordance with the number of identified plasma states. The distance may thus also be able to be established.

The second time range which is located at the point corresponding to the first time range in a second period of the plasma supply signal may have the same phase length as the first time range. It may have the same time interval from the crossover for an alternating signal with a positive and a negative portion.

The distance can be established by the minimum distance from the first signal path in the time direction having the minimum time difference and the minimum distance from the first signal path in the signal amplitude direction having the minimum signal amplitude difference.

The establishment of the threshold value line can be carried out by a calculation being carried out from a first signal path, minimum time difference and minimum signal amplitude difference in such a manner that the threshold value line has the minimum time difference as the minimum distance from the first signal path in the time direction and has the minimum signal amplitude difference as the minimum distance from the first signal path in the signal amplitude direction.

The establishment of the distance or the threshold value line can be carried out by adding and/or subtracting the minimum time difference and the minimum signal amplitude difference to or from the first signal path. In this instance, the addition or subtraction can be carried out vectorially. That is intended to mean: the minimum time difference is added or subtracted in the time direction and the minimum signal amplitude difference is added or subtracted in the signal amplitude direction, respectively. The addition or subtraction may be carried out in a state adapted to an increasing or decreasing edge or positive or negative portions of the signal path. The methods and the devices ensure that the distance from the first signal path has a minimum distance at each point of the first signal path irrespective of how steeply or shallowly the plasma supply signal extends.

The "distance" is clearly set out between the first signal path and the threshold value line in a graphic, in which a detected signal path of the plasma supply signal is indicated over time. That distance has the minimum time difference during the signal path in the time direction as a minimum width. However, that distance simultaneously also has the minimum signal amplitude difference as the minimum magnitude during the signal path in the signal amplitude direction. That distance may also be the value. A circle of identical size having a center point at the point of the first or second signal path is then clearly indicated at each point of the first or second signal path. The radius of the circle then corresponds to the value.

It is generally applicable to the invention that the distance to be established may be greater in the time direction than the minimum time difference but not smaller. In the same manner, the distance to be established may be greater in the signal amplitude direction than the minimum signal amplitude difference but not smaller.

The identification signal may indicate any state or error in the plasma process. In particular, it may be an arc identification signal.

The detection of the first signal path may be carried out within a first time range within precisely one period of the plasma supply signal by detecting at least one plasma supply signal. The detection is then particularly simple.

The detection of the first signal path may also be carried out by detecting at least one plasma supply signal within a plurality of time ranges within a plurality of periods of the plasma supply signal. The first signal path can then, for example, constitute a mean path over the time range. Thus, errors in the detection of the first signal path can be reduced.

The first signal path may, for example, also constitute a maximum or minimum path over the time range. Thus, the sensitivity of the monitoring can be influenced. The same applies to the detection of the second signal path.

The additional period(s) for detecting the second signal path do not have to but may directly follow the first period(s). The monitoring is then very rapid.

The plasma supply signal may be a signal which is in relation to a plasma supply voltage, a plasma supply current, a plasma supply impedance, a plasma supply power, a power reflected by the plasma or a different variable which is in a relationship with the plasma supply. It may also be a combination of a plurality of those variables. A plurality of plasma supply signals may also be detected and combined to form a signal path. In particular, however, the plasma supply signal may, with the methods and devices, be a single signal, in particular a signal which is in relation to a plasma supply voltage, in particular the plasma supply voltage itself.

The detection of the first signal path may also be carried out by detecting at least one plasma supply signal within a plurality of first time ranges within a period of the plasma supply signal. Thus, for example, a period can be divided into a plurality of time ranges which are each monitored individually. For each time range, it is possible to establish or predetermine individually whether the establishment of the distance is carried out by means of the minimum time difference, minimum signal amplitude difference or by combining the minimum time difference and minimum signal amplitude difference. The same applies to the detection of the second signal path.

The signal detection device for detecting the at least second signal path may be an identical signal detection device, in particular the same signal detection device, for detecting the at least first signal path.

A device or a method of the type described has the advantage that only two values have to be predetermined, that is to say, the minimum signal amplitude difference and the minimum time difference, and the identification signal generation can then be identified over the complete path of the periodically changing output signal with a high level of reliability. In the regions in which the edge steepness of the periodically changing output signal is high, the minimum time difference ensures that small fluctuations which are not produced by an error, for example, an arc in the plasma, do not result in a false identification, in particular identification of an error. In the regions in which the periodically changing output signal takes up a flat path, the minimum signal amplitude difference ensures that small fluctuations which are not produced by an error, for example, an arc in the plasma, do not result in a false identification, in particular identification of errors.

In order to detect the signal paths, the voltage between the power generator and the plasma process can be measured. Generally, two lines extend from the power generator to the plasma process and connect the plasma process to the power generator, and power is supplied to the plasma via those lines. Each one of those lines is connected to one electrode in the plasma chamber. The plasma chamber itself is generally connected to reference earth. The two electrodes each have a voltage progression with respect to that earth. In order to detect the signal paths, the voltage between an electrode and the reference earth can be measured.

In particular, the voltage with respect to the reference earth can be measured at a plurality of electrodes.

In particular, the voltage with respect to the reference earth can be measured at each electrode.

The measurement of the voltage with respect to the reference earth can be carried out by means of a resistance voltage divider.

The resistance voltage divider can be constructed so as to have breakdown-resistant high-voltage protective impedances. Safe low voltage is then made available for a subsequent voltage measurement device. In particular, a plurality of such protective impedances can be connected in series. Safe low voltage is then made available for a subsequent voltage measurement device, even if the high-voltage protection of a protective impedance fails.

In particular, the resistance voltage divider can further be adapted capacitively. Rapid voltage changes are not thereby damped, but instead supplied to a voltage measurement device with a slight time loss. That increases the speed of identification of changes in the plasma.

The measurement of the voltage with respect to the reference earth can be carried out by means of a capacitive voltage divider. The voltage measurement can then be carried out in a state galvanically separated from the plasma chamber voltage. Safe low voltage is also thus made available for a subsequent voltage measurement device.

In order to detect the signal paths, a high-resolution analogue/digital converter (ADC) can be used. The ADC can operate with a time resolution which is greater than or equal to 10 megasamples per sec., in particular greater than or equal to 40 megasamples per sec., in a particularly preferred manner with a resolution greater than or equal to 80 megasamples per sec.

The ADC can operate with an amplitude resolution greater than or equal to 8 bit, in particular greater than or equal to 10 bit, more preferably 12 bit, in a particularly preferred manner with a resolution greater than or equal to 14 bit.

An SAR converter can be used as the ADC, that is, a converter with Successive Approximation Register. The error identification then becomes particularly rapid.

The identification signal generation device can be accommodated in a programmable logic module (PLD) and the generation of the identification signal can be carried out therein. In particular, the identification signal generation device can be accommodated in an FPGA (Field Programmable Gate Array) and the generation of the identification signal can be carried out therein. As a result, it is possible to calculate the distance or threshold value line in a particularly rapid manner.

The data which are digitized by the ADC can be supplied to the PLD or the FPGA by means of a parallel bus. That can be carried out particularly rapidly with relatively low transmission rates.

The data which are digitized by the ADC can be supplied to the PLD or the FPGA by means of serial data transmission. That can be carried out, for example, by means of high-speed data transmission, for example, with LVDS (Low Voltage Differential Signalling). PLD or FPGA modules often have a special input for such serial data interfaces. Thus, the number of lines can be reduced and connections to the PLD or FPGA become free.

The establishment of the threshold value line may be carried out in the following steps:

a) selecting a first selection point from the detected first signal path, b) establishing a third time range which extends from a first time to a second time, the first time being calculated at the time of the selection point minus the minimum time difference and the second time being calculated at the time of the selection point plus the minimum time difference, c) establishing an extreme value amplitude by forming the minimum value of the first signal path within the third time range, d) establishing the first threshold value line point by subtracting the minimum signal amplitude difference from the extreme value amplitude and transmitting the time of the selection point at the time of the threshold value line point, e) continuing the steps a) to d) for additional selection points from the detected first signal path.

Instead of establishing the lowest value, the highest value can also be established. Instead of subtracting the minimum signal amplitude difference from the extreme value amplitude, it is then particularly possible to carry out an addition of the minimum signal amplitude difference to the extreme value amplitude.

That is advantageous, for example, for a negative half-wave. It is also advantageous in the case of a positive half-wave if the monitoring is intended to be carried out with a signal, in which an identification is intended to be carried out if the signal produces an increase such as, for example, when a current path is monitored during arc identification.

A further aspect of the invention features a plasma power supply system having a power generator which is configured to supply power to a plasma process with a periodically changing output signal of the power generator, the plasma power supply system having a monitoring device of the above-mentioned type(s).

The periodically changing output signal of the power generator may be an alternating signal. In particular, it may be an alternating signal having a positive and negative half-wave.

In particular, the alternating signal may be an alternating signal having a current source characteristic.

The power generator may be a free-running MF generator.

The power generator may be a bipolar-pulsed generator. In particular, the duration and amplitude for the positive and negative half-wave can be individually adjusted for such generators.

The power generator may have a bridge circuit for producing the alternating voltage.

The power generator may be an MF generator with an output oscillating circuit.

The output oscillating circuit may have a parallel oscillating circuit. The parallel oscillating circuit may have a capacitor and an inductor which are both connected to the output of the bridge circuit in a parallel manner.

An additional series capacitor can be connected in series between the parallel oscillating circuit and plasma process.

The output oscillating circuit can have a series oscillating circuit. The series oscillating circuit may have a capacitor and an inductor which are connected in series between the output of the bridge circuit and the plasma process.

An additional capacitor can be connected in parallel between the two lines which connect the series oscillating circuit and the plasma process.

When an arc is identified, all the switching elements of a circuit arrangement which produces the periodically changing output signal of the power generator can be switched off. In particular, all the switching elements of a bridge circuit which produces the alternating signal can be switched off.

Various implementations of the devices, methods, and systems of the invention can operate particularly rapidly and reliably, while being easy to set up. In particular, arcs can thereby be identified in a very reliable and very rapid manner.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
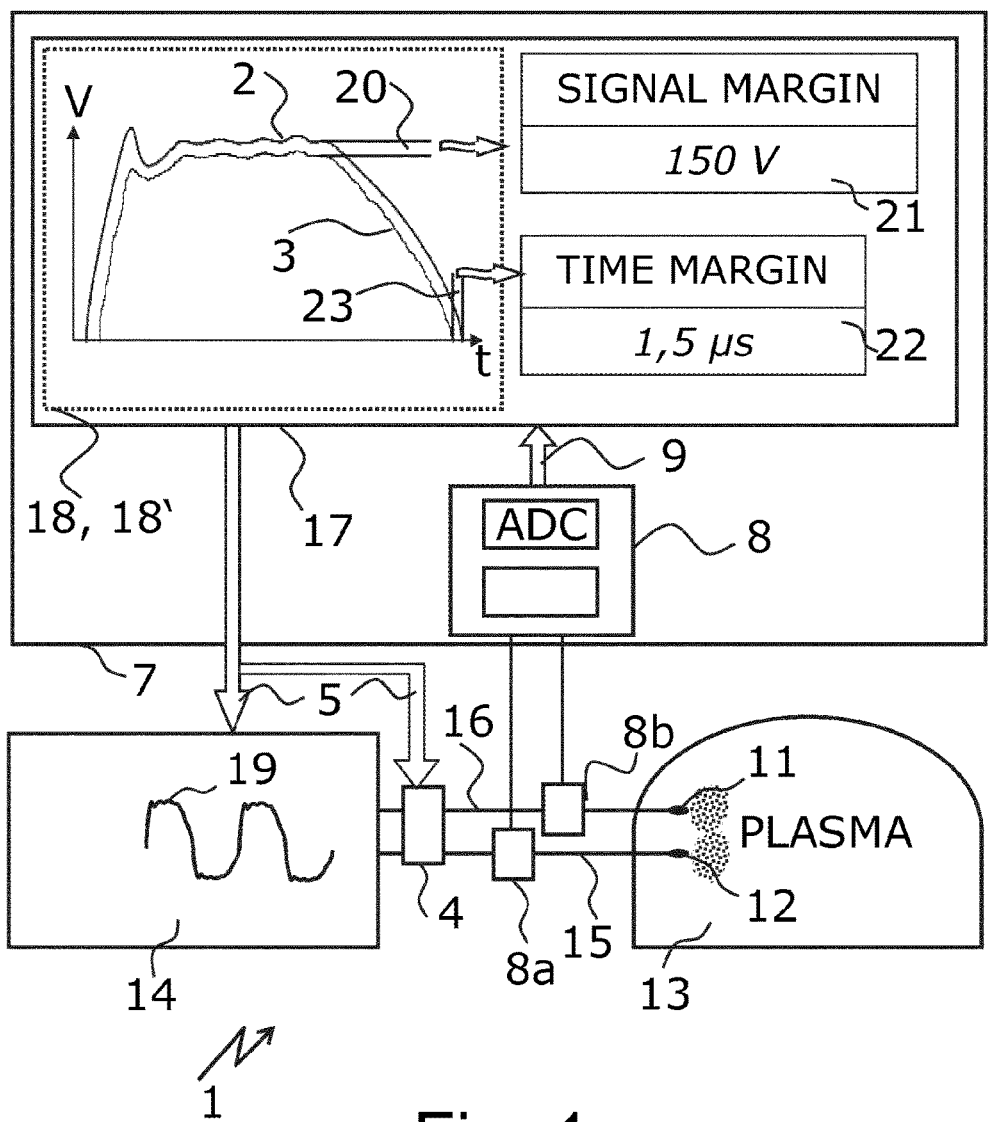
FIG. 1 shows an example plasma process system having a power generator and a monitoring device.

FIG. 1 shows a plasma process system 1 having a power generator 14 and a monitoring device 7. The power generator 14 supplies the plasma process with power having a periodically changing output signal. That output signal is the plasma supply signal 19 in the present case. The output signal of the power generator 14 is an alternating signal having a positive and a negative half-wave in the present example.

The power generator 14 may be a free-running MF generator.

The power generator 14 may also be a bipolar-pulsed generator. In particular, the positive and the negative half-wave can then be adjusted individually.

The power generator 14 may have a bridge circuit for producing the alternating voltage.

The power is supplied via two lines 15, 16 to an electrode 11, 12 in the plasma chamber which may be constructed, for example, as a cathode sputtering arrangement 13, respectively.

The voltage on the lines 15, 16 is measured with a signal detection device 8. The voltage is tapped from the lines 15, 16 by means of voltage measurement devices 8a, 8b. The signal detection device 8 has an ADC. The digitized measurement results are transmitted to the monitoring device 7 via a data bus 9. The signal detection device 8 may also be arranged so as to be spatially remote from the remainder of the monitoring device 7.

The signal detection device 8 detects a first signal path 2 of a plasma supply signal 19 within a first time range within a first period of the plasma supply signal 19 and a second signal path 6 of a plasma supply signal within a second time range which is located at the point corresponding to the first time range in a second period of the plasma supply signal.

The monitoring device 7 outputs an identification signal 5. That signal may be made available to the power supply 14 or other components such as, for example, an arc extinguishing device 4.

The identification signal 5 is activated when the identification signal generation device 17 establishes a deviation of the second signal path 6 by more than a distance from the first signal path 2. The identification signal generation device 17 has for this purpose a distance establishment device 18 which is configured to establish the distance by means of combining a minimum time difference 22 (TIME MARGIN) and minimum signal amplitude difference 21 (SIGNAL MARGIN).

The identification signal 5 is also activated when the identification signal generation device 17 establishes that a threshold value line 3 has been reached by the second signal path. The threshold value line 3 is established from the first signal path 2 by means of a threshold value line establishment device 18', the threshold value line establishment device 18' adding both a minimum time difference 22 (TIME MARGIN) and a minimum signal amplitude difference 21 (SIGNAL MARGIN) to the first signal path.

For illustration, a graphic with the voltage V over time t of a half-wave is illustrated within the threshold value line establishment device 18'. This graphic illustrates the first signal path 2. The threshold value line 3 is further illustrated. The distance is the minimum distance between the first signal path 2 and the threshold value line 3. That is again illustrated in the graphic by the minimum time difference distance 23 and the minimum signal amplitude difference distance 20.

In the present example, the minimum time difference 22 is adjusted to 1.5 μs which is a practical value which provides very good results for many plasma processes. Good values are from 0.5 μs to 5 μs, in a particularly preferable manner values are between 0.7 μs and 2 μs.

In the present example, the minimum signal amplitude difference 21 is adjusted to 150 V which is also a practical value which provides very good results for many plasma processes. Good values are from 50 V to 200 V, in a particularly preferable manner values are between 100 V and 150 V.

The values may also be set out in a relative manner. For example, the minimum time difference 22 may be set out as a proportion of the duration of a half-wave or period, for example, 0.3%. The minimum time difference 22 does not then have to be adjusted subsequently in the event of a change in frequency. For example, the minimum signal amplitude difference 21 may be set out as a proportion of the effective value or the peak value of the output signal, for example, 20%. The minimum signal amplitude difference 21 does not then have to be adjusted subsequently in the event of a change in amplitude.

Figure 2:
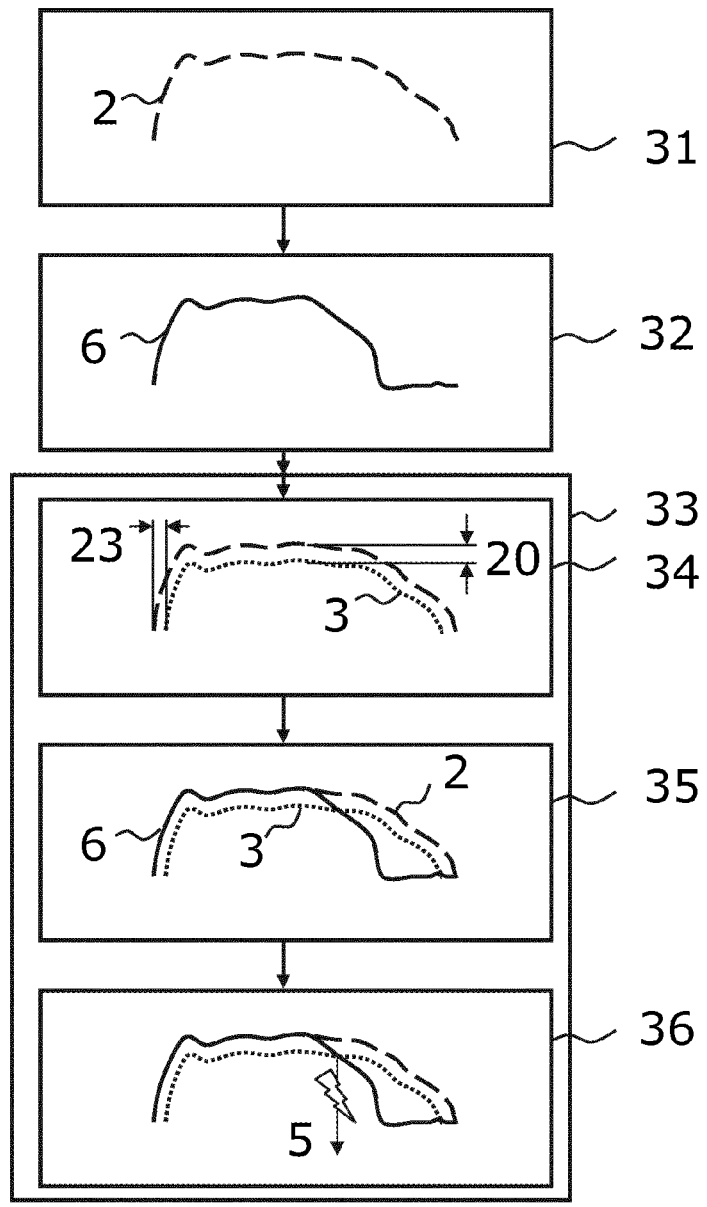
FIG. 2 shows steps of an example method for monitoring a plasma discharge.

FIG. 2 shows the steps of the method for monitoring a plasma discharge. In method step 31, a first signal path 2 of a plasma supply signal within a first time range within a first period of the plasma supply signal is detected. In method step 32, a second signal path 6 of a plasma supply signal within a second time range which is located at the point corresponding to the first time range in a second period of the plasma supply signal is detected. In method step 33, an identification signal 5 is generated if the second signal path 6 deviates by more than a distance from the first signal path 2, the distance having a minimum time difference 22 and a minimum signal amplitude difference 21.

The method step 33 may also be described so as to be divided into a plurality of method sub-steps. In method sub-step 34, a threshold value line 3 is established from the first signal path 2. Both a minimum time difference 22 and a minimum signal amplitude difference 21 are added to the first signal path 2. This step is illustrated with the minimum time difference distance 23 and the minimum signal amplitude difference distance 20, as described above. In method sub-step 35, the second signal path 6 is compared with the threshold value line 3. In method sub-step 36, an identification signal 5 is generated at the time when the second signal path 6 falls below the threshold value line.

Figure 3:
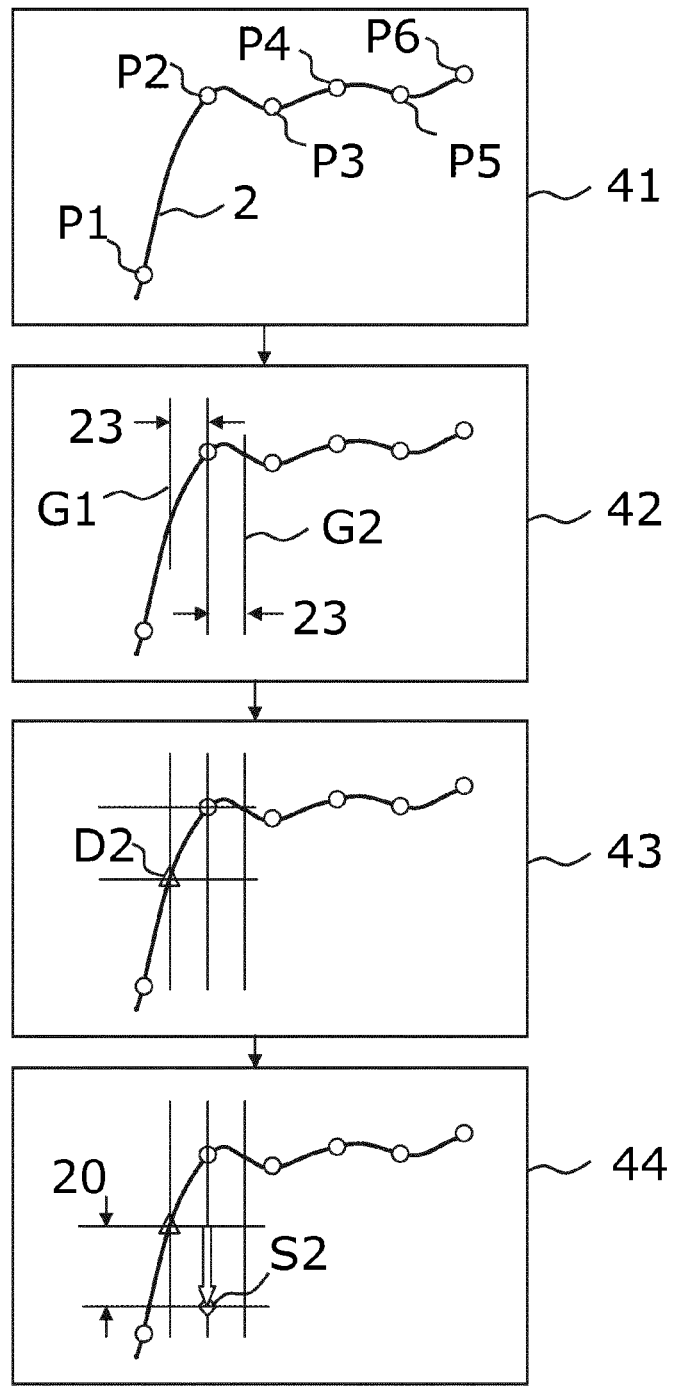
FIG. 3 shows method steps for establishing a threshold value line point.

In FIG. 3, a possible method sequence for establishing the threshold value line 3 is described. In method step 41, a plurality of selection points P1, P2, P3, P4, P5 and P6 are selected from a first signal path 2. The time interval of those points is equidistant in the present case. This is not absolutely necessary. It is not necessary to select each sample point of the first signal path 2. Every tenth or every hundredth or every thousandth sample point may be selected. A good balance must be found between a high level of precision and speed of generation of the identification signal. At each of the selection points P1-PN (N=2, 3, 4, 5 . . . ), a threshold value line point S1-SN (N=2, 3, 4, 5 . . . ) is established for the threshold value line 3. That establishment is carried out, for example, in an FPGA. It must be carried out particularly quickly. For that reason, there is selected a calculation method which leads to a result in an FPGA as simply, reliably and rapidly as possible. To that end, in method step 42 the minimum time difference distance 23 in the time direction is added once and subtracted once to/from the time of the point P2. That results in two new times which determine a third time range. This is set out in method step 42 by means of two perpendicular straight lines G1, G2. At both times, a value of the signal amplitude of the first signal path 2 is established. This is set out in method step 45. The first signal path 2 is in the present example a positive half-wave of a measured voltage. That path is intended here to be observed with respect to a value falling below the threshold value line 3. For that reason, the smaller of the two established values of the signal amplitude is established. In the present case, that is the value which the signal path 2 reaches at the amplitude point D2. The only significant aspect here is the amplitude value of the amplitude point D2. The time of the amplitude point D2 is not required for the additional steps. In the subsequent method step 44, the minimum signal amplitude difference distance 20 is subtracted from this amplitude value. The first established threshold value line point S2 of the threshold value line 3 is now calculated. It is calculated as:

time (*S2*)=time of the selected selection point *P2* and amplitude (*S2*)=amplitude of the amplitude point *D2* minus the minimum signal amplitude difference distance 20, where the following applies to the amplitude point D2:
minimum or maximum value in a time range which extends from the time of the selected selection point P2 minus the minimum time difference distance 23 until the time of the selected selection point P2 plus the minimum time difference distance 23.

Figure 4:
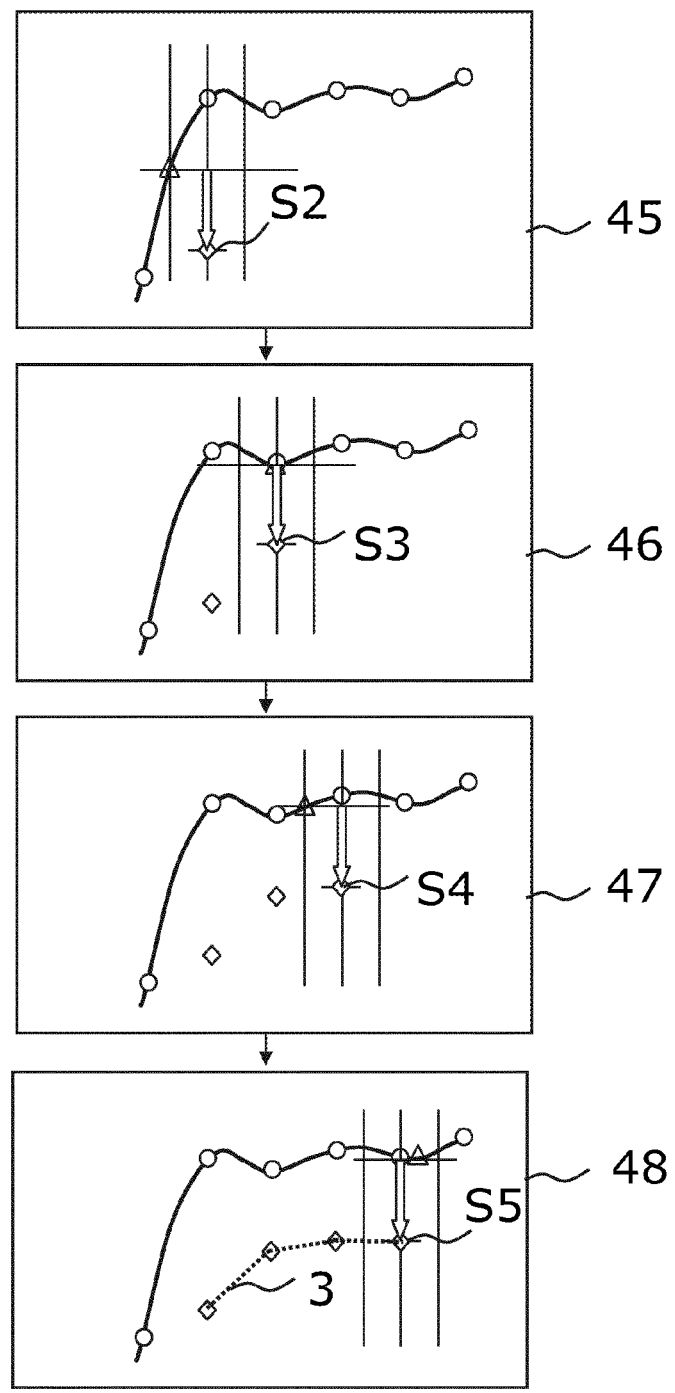
FIG. 4 shows method steps for establishing a plurality of threshold value line points for establishing a threshold value line.

FIG. 4 shows the establishment of a plurality of threshold value line points S2-S5 of the threshold value line 3 according to the method from FIG. 3. As a first method step 45, the method steps 41 to 44 from FIG. 3 are combined to determine the threshold value line point S2 from the selection point P2. In the method steps 46 to 48, in accordance with the same principle the threshold value line points S3 to S5 are established from the selection points P3 to P5. The threshold value line 3 may be interpolated between the threshold value line points S3 to S5 and, where applicable, preceding and subsequent threshold value line points.

Figure 5:
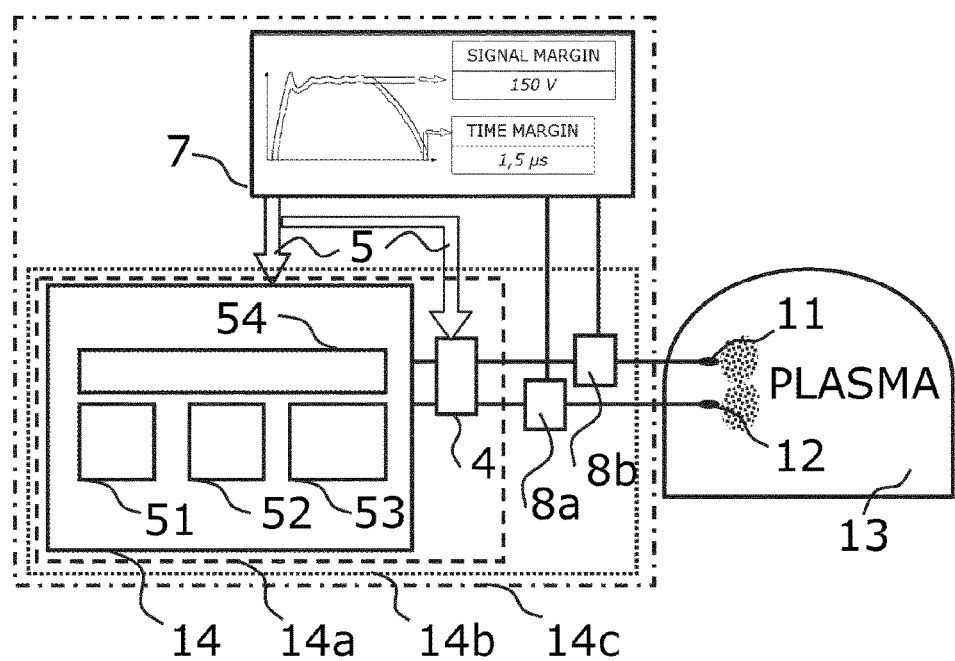
FIG. 5 shows a plasma process system with an embodiment of a power generator.

FIG. 5 shows a plasma process system 1 having a power generator 14 and a monitoring device 7, with an embodiment and a detailed view of the power generator 14. The power generator 14 has an alternating current/direct current transformer 51 (AC/DC transformer) which transforms the alternating current voltage supplied by the network into direct current voltage.

The alternating current voltage supplied by the network generally has a frequency of 50 Hz or 60 Hz. It may be supplied by the network as a two-phase or multi-phase, in particular three-phase supply. For high powers, a plurality of AC/DC transformer modules can be provided, in particular connected in a parallel manner. AC/DC transformers 51 may have passive filters and active Power Factor Correction members (PFC members) in order to disrupt the alternating current voltage supplied by the network as little as possible with harmonic waves.

The alternating current voltage supplied by the network is generally in the range from 200 to 500 V effective voltage. Higher voltages and higher frequencies are generally necessary to ignite the plasma and to maintain it. For that reason, the direct current voltage is transformed into alternating current voltage in an alternating current voltage production device 52. The alternating current voltage production device 52 often has a bridge circuit. For high powers, it is also possible to provide a plurality of bridge circuits and in particular to operate them in a parallel manner.

The power generator 14 may be an MF generator having an output oscillating circuit 53. Possible embodiments of the output oscillating circuit 53 are described below.

Generally, a power generator 14 has a superordinate control unit 54. This may be a common control unit for the AC/DC transformer 51 and the alternating current voltage production device 52. The control unit 54 may also have one or more regulation units, for example, for regulating the output voltage, the output frequency, the output current or the output power. The input current can also be regulated. There may be provided for the regulation one or more measurement value recorders which detect the actual values of the variables which are intended to be regulated. Furthermore, one or more user interfaces may be provided in order to adjust desired values for regulating and/or for monitoring and/or for controlling the power generator 14.

The arc extinguishing device 4 may be arranged externally with respect to the power generator 14 or be a component of an extended power generator 14a. The arc extinguishing device 4 may particularly then be controlled by the control unit 54.

The voltage measurement devices 8a, 8b may be arranged externally with respect to the power generator 14 or 14a or be a component of an extended power generator 14b. The monitoring device 7 may be arranged externally with respect to the power generator 14, 14a or 14b or be a component of a power generator system 14c. The monitoring device 7 may then be a component of the control unit 54.

Figure 6:
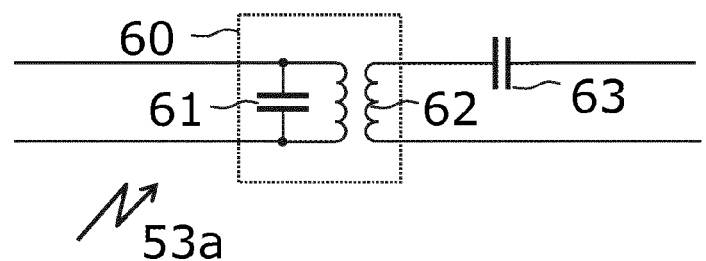
FIG. 6 shows a first embodiment of an output oscillating circuit.

FIG. 6 shows a first embodiment of an output oscillating circuit 53a, as may be provided in FIG. 1 and FIG. 5 as an output oscillating circuit 53. The output oscillating circuit 53a may have a parallel oscillating circuit 60. The parallel oscillating circuit 60 may have a capacitor 61 and an inductor 62 which are both connected to the output of the bridge circuit in parallel. The inductor 62 may be part of a transformer.

An additional series capacitor 63 may be connected in series between the parallel oscillating circuit 60 and the plasma process.

Figure 7:
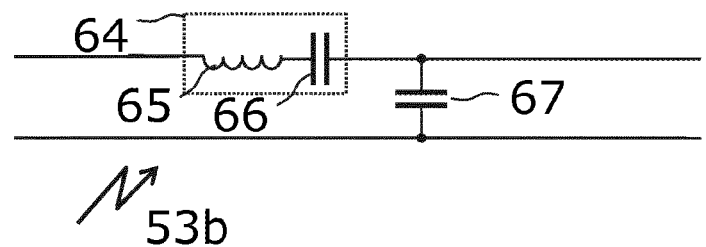
FIG. 7 shows a second embodiment of an output oscillating circuit.

FIG. 7 shows a second embodiment of an output oscillating circuit 53b, as may be provided in FIG. 1 and FIG. 5 as an output oscillating circuit 53. The output oscillating circuit 53b may have a series oscillating circuit 64. The series oscillating circuit 64 may have a capacitor 66 and an inductor 65 which are connected in series between the output of the bridge circuit and the plasma process.

An additional parallel capacitor 67 may be connected in parallel between the two lines which connect the series oscillating circuit and the plasma process.

Figure 8:
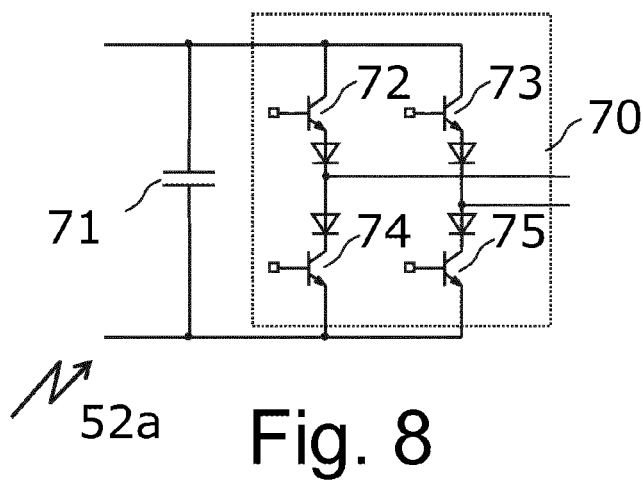
FIG. 8 shows an embodiment of an alternating voltage production device.

FIG. 8 shows an embodiment of an alternating current voltage production device 52a, as may be provided in FIG. 1 and FIG. 5 as an alternating current voltage production device 52. It has a bridge circuit 70 which is provided in this embodiment as a full bridge circuit with four switching elements 72, 73, 74, 75. The switching elements may preferably be transistors. IGBT or MOS-FET are particularly preferred. A uniform voltage is supplied to the bridge circuit 70 via two lines to which a capacitor 71 is connected. That is the typical construction for a voltage-operated bridge circuit. It is also possible, instead of a voltage-operated bridge circuit, to provide a current-operated bridge circuit. A series-connected inductor would be connected in one or both of the lines supplying direct current voltage in place of the parallel-connected capacitor 71 for a current-operated bridge circuit.

Figure 9:
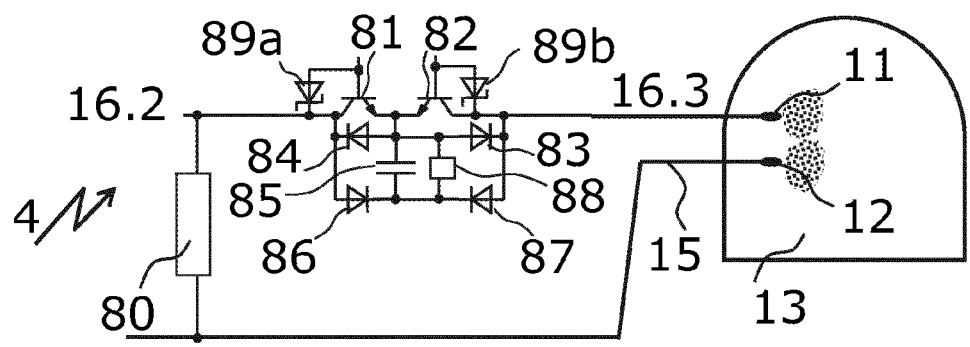
FIG. 9 shows an embodiment of an arc extinguishing device.

FIG. 9 shows an embodiment of an arc extinguishing device 4, as may be provided in FIG. 1 and FIG. 5 as an arc extinguishing device 4. An energy store 85 is in the form of a capacitor in the embodiment. The energy store 85 is connected to a line portion 16.2 via a switch 81 in the form of an IGBT and a diode 84 which is connected in an anti-parallel manner. It is further connected to the line portion 16.3 via the switch 82 in the form of an IGBT and the diode 83 which is connected in an anti-parallel manner. In a particularly preferred manner, MOS-FET may also be used for the switches in addition to IGBT. The other connection of the energy store 85 is connected, on the one hand, via the diode 86 to the line portion 16.2 and via the diode 87 to the line portion 16.3. The diodes 86, 87 are connected in a non-series manner. The switch 81 forms with the diode 84 a switch arrangement and the switch 82 forms with the diode 83 a switch arrangement. The energy store 85 is connected between the connection location of the diodes 86, 87 and the connection location of the switch arrangements. The cathodes of the diodes 86, 87 are connected at a connection location. The anode of the diode 86 is connected to the line portion 16.2. The anode of the diode 87 is connected to the line portion 16.3.

In the event of arc identification, the switches 81, 82 which are closed during normal operation are opened. A current thereby no longer flows via the diodes 83, 84 and switches 81, 82 but instead via the diodes 86, 87 to the diodes 83, 84. Energy in the lines 15, 16 and in the cathode sputtering arrangement 13 is charged to the energy store 85. As a result of the switching state of the switches 81, 82 which are non-linear components and the arrangement of the diodes 83, 84, 86, 87, a return flow of energy from the energy store 85 into the lines 15, 16 and in particular the cathode sputtering arrangement 13 is prevented. In particular only two structurally identical modules may be used and each have a switch 81 and 82 and two diodes 83, 84 and 86, 87. The transfer of energy to the energy store 85 operates independently of which half-wave of the alternating current voltage is currently applied across the cathode sputtering arrangement 13 or independently of the direction of the current flow in the cathode sputtering arrangement 13.

The monitoring device 7 outputs an identification signal 5. This may be used to control the switches 81, 82.

A charging device 88 is arranged parallel with the energy store 85. This device may have a direct current voltage source or direct current source in order to be able to precharge the energy store 85. It can further have a discharge circuit parallel with the energy store 85, for example, a switch and a resistor, via which the energy store 85 can be discharged. It can further have a voltage monitoring unit which monitors the charging state of the energy store 85 and activates the discharging device if a predetermined voltage value is reached, or also deactivates it again if a second predetermined voltage value is reached. The discharging device may also be configured to again provide the energy to be discharged for the supply voltage at least partially via a transformer, a direct current voltage transformer or similar switching components.

The arc extinguishing device 4 may also be operated without an energy store 85 and without diodes 86, 87 and without a charging device 88. In particular in this instance, there may be provided for each transistor a voltage limiting circuit which is indicated with a Zener diode 89a, 89b. During normal operation, the transistors are connected in a conductive manner. As soon as the voltage limiting circuit determines a voltage which exceeds a predetermined value, the Zener diodes 89a, 89b become conductive and therefore also connect the transistors in a conductive manner again so that the transistors are protected against overvoltage.

When an arc is identified, all the switching elements of a circuit arrangement which produces the periodically changing output signal of the power generator can be switched off. In particular, all the switching elements of a bridge circuit which produces the alternating signal can be switched off.

When an arc is identified, a connection element 80, as described, for example, in EP1720195, may further be switched on.

Figure 10:
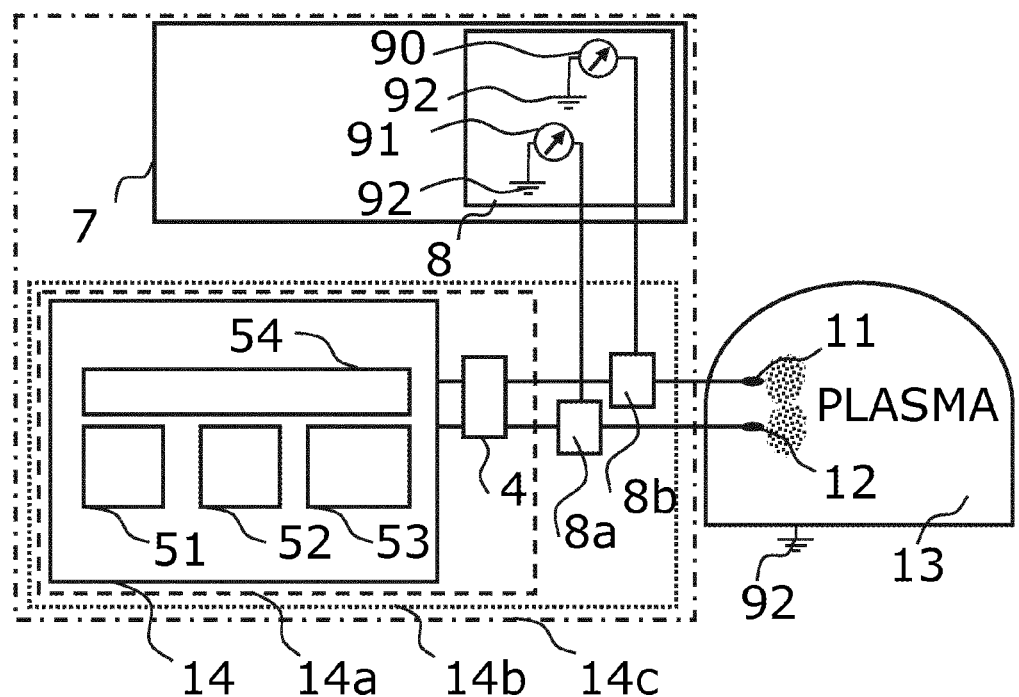
FIG. 10 shows a plasma process system as in FIG. 5 with an embodiment of a signal detection device.

FIG. 10 shows a plasma process system as in FIG. 5 with an embodiment of a signal detection device 8. The voltage is measured at each of the two electrodes 11, 12 with a measurement data detection device 91, 90 with respect to the reference earth 92. Each of those voltages may be taken as the plasma supply signal for the additional detection of signal paths. In order to establish the voltage which is applied across the two electrodes 11, 12, the first voltage of the first measurement data detection device 91 can be subtracted from the second voltage of the second measurement data detection device 90. The result of the subtraction may also be taken as the plasma supply signal for the additional detection of signal paths. This result is particularly low in terms of faults because in particular common-mode faults are reduced by the subtraction.

The method and the device can also be used to identify plasma. It is important for the monitoring device for monitoring a discharge in a plasma process to identify whether a plasma is ignited or has not yet ignited. In particular, an arc processing operation can also be prevented in the case of arc identification according to the above-described method in the case of non-ignited plasma. The identification of whether a plasma is ignited can be carried out, for example, with the first voltage of the first measurement data detection device 91. To that end, the direct component of that voltage is monitored. When a specific direct component threshold value is reached, an ignited plasma is identified. This is intended to be explained with reference to a sine alternating current voltage at the output of the power generator.

Figure 11:
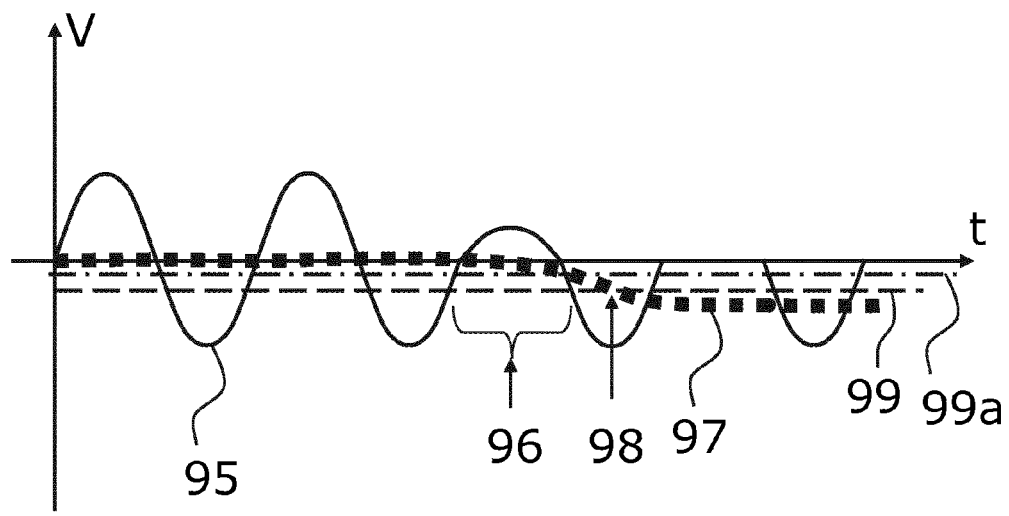
FIG. 11 shows a time progression of a voltage at a cathode when a plasma is ignited.

FIG. 11 shows the time progression 95 of the voltage at a cathode when the plasma is ignited. The voltage V over time t is indicated. For example, it must be identified, for the activation of the auxiliary ignition means or an arc identification in MF generators, whether the plasma is already ignited or not.

Other applications are also conceivable. For example, an indication to the plasma process operator concerning whether the plasma is ignited for controlling his process.

By evaluating the arithmetic mean value of the voltage at a plasma electrode with respect to the earth, it is possible to distinguish the ignited operation from the non-ignited operation. In the case of burning plasma, a negative arithmetic mean value of the voltage with respect to the earth is produced at an electrode. If no plasma is burning, the arithmetic mean value of the voltage is approximately zero. Alternatively or additionally, the time progression 95 of the voltage can be investigated with regard to the peak values of the voltage. A decrease of the peak values of the positive voltage also indicates plasma identification. The difference between the positive and negative peak values can also be used for plasma identification. The voltage established at the measurement data detection device 90 in the case of non-ignited plasma and in the case of a sine alternating current voltage at the output of the power generator is shown in FIG. 11. The establishment of an arithmetic mean value of the voltage results approximately in a line progression 97. That line progression is compared with a threshold 99. If that threshold is reached, it is identified that the plasma has ignited. In FIG. 11, the plasma ignites in the region 96. That can be seen from the changed line progression. The arithmetic mean value slowly decreases to negative values. At the time 98, the line progression 97 reaches the threshold 99. To identify that the plasma has been extinguished, another threshold 99a may be provided. Thus, a hysteresis is produced in the event of identification "Plasma not ignited" to "Plasma ignited" at the time 98 and further to "Plasma extinguished". It is possible to produce this with a comparator with hysteresis.

Figure 12:
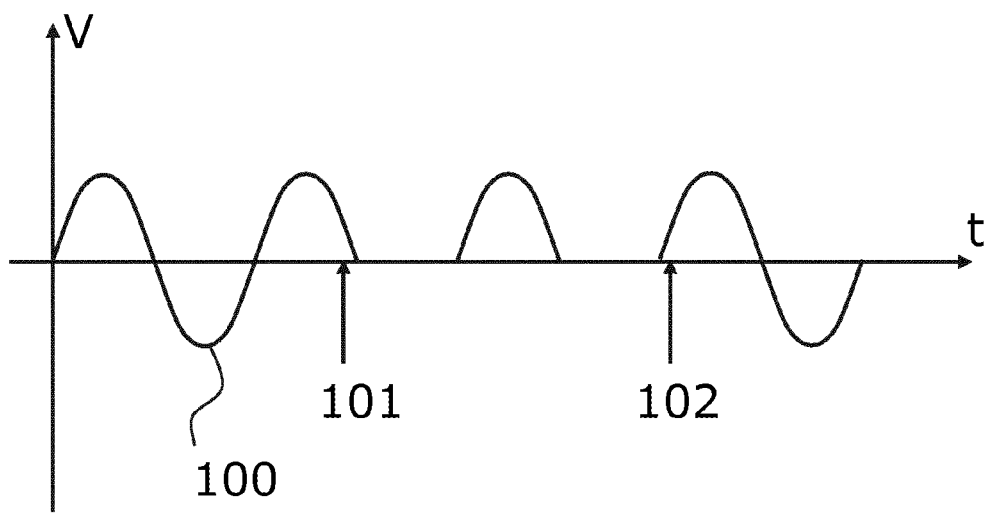
FIG. 12 shows a voltage progression between electrodes in a plasma chamber when asymmetries are corrected.

FIG. 12 shows a voltage path 100 between the electrodes 11, 12 in a plasma chamber, in particular the cathode sputtering arrangement 13 when correcting asymmetries. The voltage V over time t is indicated. In the case of a cathode sputtering arrangement 13, in particular a dual magnetron cathode sputtering arrangement, there may be produced asymmetries of the two cathodes 11, 12, in particular of the targets connected thereto. The cathode sputtering result of the two cathodes will thereby be different, as a result of unequal stoichiometry.

Owing to the active displacement of the direct voltage portion of an alternating current voltage signal which is supplied to the plasma process, the symmetry of the cathodes can be produced again. By means of a predetermined influence of an arc extinguishing device 4, the mean value of the voltages of the cathodes can be regulated with respect to earth.

The alternating current voltage production device 52, 52a can further be selectively influenced, in particular the switching elements 72 to 75 of a bridge circuit 70 can be selectively influenced.

In particular, the voltage at one or both cathodes 11, 12, as shown in FIG. 10, can be measured with respect to the reference earth 92 in order to monitor the balancing.

In order to produce a displacement, a half-wave at a cathode would be suppressed by means of the arc extinguishing device 4. To that end, only one switch 81 or 82 would be switched off. This can be carried out, for example, for the duration of a half-wave. However, it can also be carried out for a plurality of half-waves. In the example shown, it is carried out in the time range between the times 101 and 102. At the same time, the bridge circuit 70 can be selectively influenced so that no energy is conducted into the oscillating circuit for the half wave(s). That operation can be repeated within approximately one hundred waves up to several tens of times. In the mean value above one hundred waves, a direct current voltage correction of a few 10% could thus be achieved.

Figure 13:
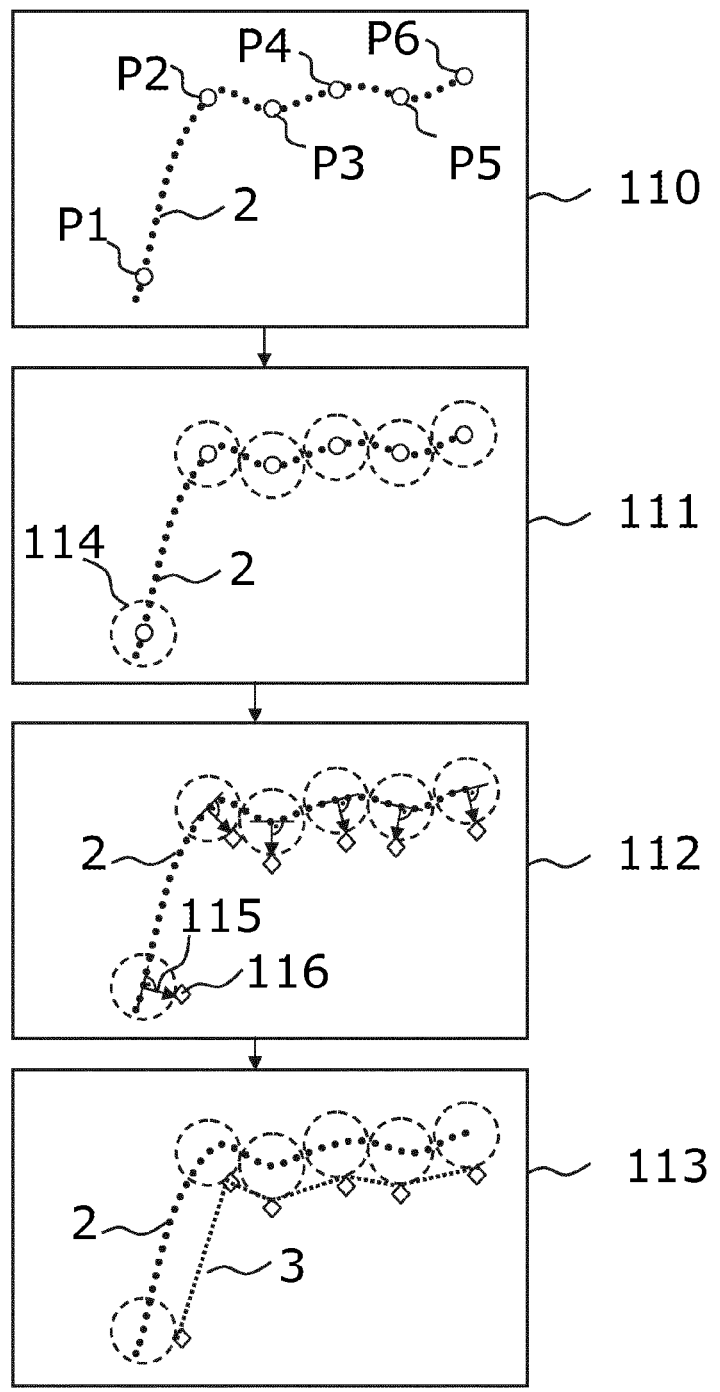
FIG. 13 shows method steps for establishing a plurality of threshold value line points for establishing a threshold value line.

FIG. 13 shows method steps for establishing a plurality of threshold value line points 116 for establishing a threshold value line 3 according to another method variant. In a first method step 110, a plurality of selection points P1, P2, P3, P4, P5 and P6 are selected from a first signal path 2, as in the method step 41 in FIG. 3. In a second method step 111, circles 114 are placed around those selection points with an established or predetermined value. The center of the circle 114 is located at the selection point, respectively. The circles may also be ellipsoidal. In a third method step 112, a vector 115 having the length of the value, that is, up to the edge of the circle 114, is inserted perpendicularly to the gradient of the first signal path 2 in a first selection point. The tip of the arrow or vector 115 is now directed towards the established threshold value line point 116. This is carried out for all the selection points. In this manner, for each selection point there is obtained a threshold value line point. The threshold value line points are now connected to an interpolation. In that manner, the threshold value line 3 is obtained.

Figure 14:
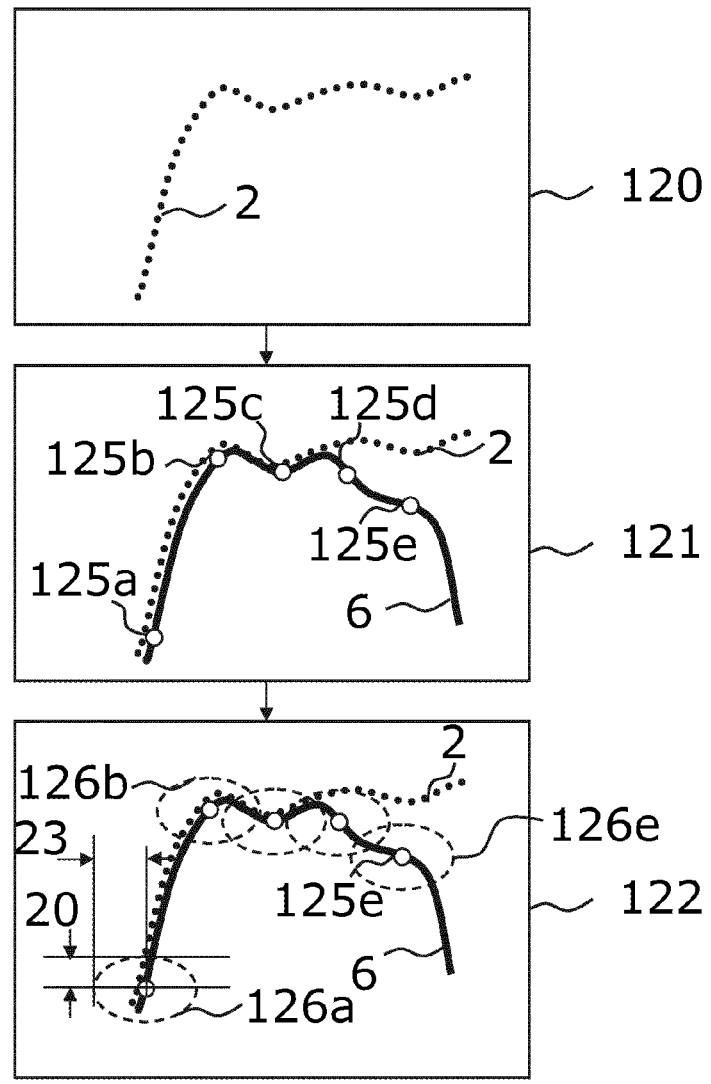
FIG. 14 shows method steps for establishing a deviation of a second signal path by at least a distance from a first signal path.

FIG. 14 shows method steps for establishing a deviation of the second signal path 6 by at least a distance from the first signal path 2, the distance having a minimum time difference distance 23 and a minimum signal amplitude difference distance 20. In a first method step 120, the first signal path 2 is detected. In a second method step 121, the second signal path 6 is detected. For the second signal path 6, a plurality of selection points 125a, 125b, 125c, 125d, 125e are selected. The time interval of those points is equidistant in the present case. That is not absolutely necessary. It is also not necessary to select each sample point of the second signal path 6. Every tenth or every hundredth or every thousandth sample point may be selected. A good balance between a high level of precision and speed of generation of the identification signal must be found. In a third method step 121, a geometric member 126a to 126e is placed around each selection point 125a, 125b, 125c, 125d, 125e and represents the minimum time difference distance 23 and a minimum signal amplitude difference distance 20. This may be, for example, a rectangle or, as in the present case, an ellipse. The geometric member 126 has dimensions in the time direction of twice the minimum time difference distance 23 and dimensions in the amplitude direction of twice the minimum signal amplitude difference distance 20. The establishment of a deviation of the second signal path 6 by at least the above-described distance from the first signal path 2 is identified at the selection point 125e at which the geometric member 126 no longer includes the portions of the first signal path 2.

The distance establishment device, which is designed for establishing the distance by bringing together a minimum time difference and a minimum signal amplitude difference, can consequently be designed to establish the bringing together by vectorial addition of the minimum time difference and minimum signal amplitude difference.

A number of embodiments of the invention have been described. Nevertheless, it will be understood that various modifications may be made without departing from the spirit and scope of the invention. Accordingly, other embodiments are within the scope of the following claims.

What is claimed is:

1. A method of monitoring a discharge in a plasma process, the method comprising:
    detecting a first signal profile of a plasma supply signal in a first time range of a first time period of the plasma supply signal, the plasma supply signal being a periodically changing signal supplied to the plasma process;
    detecting a second signal profile of the plasma supply signal in a second time range of a second time period of the plasma supply signal, points that the second time range is located in the second time period corresponding to points that the first time range is located in the first time period;
    determining a threshold by carrying out a calculation from the first signal profile, a minimum time difference, and a minimum signal amplitude difference, such that the threshold has the minimum time difference in a time direction and the minimum signal amplitude difference in a signal amplitude direction; and
    in response to determining that a difference between the first signal profile and the second signal profile is beyond the threshold, generating an identification signal that indicates a state or error in the plasma process.

2. The method of claim 1, wherein at least one of the minimum time difference or the minimum signal amplitude difference is predetermined by a user.

3. The method of claim 1, further comprising:
    establishing a reference profile from the first signal profile based on the threshold; and
    in response to determining that the second signal profile reaches the reference profile, determining that the difference is beyond the threshold.

4. The method of claim 3, wherein establishing the reference profile comprises one of:
    adding the minimum time difference and the minimum signal amplitude difference to the first signal profile, and
    subtracting the minimum time difference and the minimum signal amplitude difference from the first signal profile.

5. The method of claim 3, wherein establishing the reference profile comprises:
    carrying out a calculation from the first signal profile, the minimum time difference, and the minimum signal amplitude difference, such that the reference profile has the minimum time difference as a first minimum difference from the first signal profile in a time direction and the minimum signal amplitude difference as a second minimum difference from the first signal profile in a signal amplitude direction.

6. The method of claim 3, wherein establishing the reference profile comprises:

selecting a plurality of selection points from the first signal profile;

for each of the selection points, determining a respective reference point of the reference profile by placing a geometric shape around the selection point, the geometric shape having a center at the selection point and a predetermined value associated with at least one of the minimum time difference or the minimum signal amplitude difference, inserting a vector having a length of the predetermined value from the selection point to an edge of the geometric shape, the vector being perpendicular to a gradient of the first signal profile, and determining an intersection point between the geometric shape and a vector as the respective reference point; and obtaining the reference profile based on the determined respective reference points.

7. The method of claim 1, further comprising:

selecting a plurality of selection points of the second signal profile;

for each of the selection points, placing a respective geometric shape around the selection point, the respective geometric shape having a first dimension representing the minimum time difference in a time direction and a second dimension representing the minimum signal amplitude difference in a signal amplitude direction;

comparing the second signal profile with the respective geometric shapes with the first signal profile; and in response to determining that a portion of the first signal profile is outside of one of the respective geometric shapes, determining that the difference between the first signal profile and the second signal profile is beyond the threshold.

8. The method of claim 7, wherein the first dimension is identical to twice of the minimum time difference, and the second dimension is identical to twice of the minimum signal amplitude difference.

9. The method of claim 1, further comprising at least one of:

determining the minimum time difference based on a proportion of a duration of a period of the plasma supply signal, or determining the minimum signal amplitude difference based on a proportion of an effective value or a peak value of the plasma supply signal in the period.

10. A plasma discharge monitor for monitoring a discharge in a plasma process, the monitor comprising:

a signal detector configured to receive a plasma supply signal that is a periodically changing signal supplied to the plasma process, the signal detector being operable to:

detect a first signal profile of the plasma supply signal in a first time range of a first time period of the plasma supply signal, and detect a second signal profile of the plasma supply signal in a second time range of a second time period of the plasma supply signal, points that the second time range is located in the second time period corresponding to points that the first time range is located in the first time period; and an identification signal generator configured to:

determine a threshold by carrying out a calculation from the first signal profile, a minimum time difference, and a minimum signal amplitude difference, such that the threshold has the minimum time difference in a time direction and the minimum signal amplitude difference in a signal amplitude direction, and generate an identification signal in response to determining that a difference between the first signal profile and the second signal profile is beyond the threshold, the identification signal indicating a state or error in the plasma process.

11. The monitor of claim 10, wherein the identification signal generator is configured such that the threshold includes the minimum time difference as a first minimum difference from the first signal profile in the time direction, and the minimum signal amplitude difference as a second minimum difference from the first signal profile in the signal amplitude direction.

12. The monitor of claim 10, further comprising at least one of:

an input interface for specifying the minimum time difference and the minimum signal amplitude difference, or an input interface for specifying a value for establishing a flowing interval associated with the threshold.

13. The monitor of claim 12, wherein the value comprises a sum including a square of the minimum time difference and a square of the minimum signal amplitude difference, and wherein the identification signal generator is configured to establish the flow interval by the value and a calculation rule.

14. The monitor of claim 10, wherein the signal detector comprises an analog-digital converter (ADC) that has a temporal resolution no less than 10 megasamples per second and an amplitude resolution no less than 8 bit.

15. The monitor of claim 10, wherein the identification signal generator is accommodated in a programmable logic device (PLD).

16. The monitor of claim 10, wherein the identification signal generator is configured to:

establish a reference profile from the first signal profile based on the threshold, and in response to determining that the second signal profile reaches the reference profile, determining that the difference between the first signal profile and the second signal profile is beyond the threshold.

17. The monitor of claim 16, wherein the identification signal generator is configured to establish the reference profile such that the reference profile has the minimum time difference as a first minimum difference from the first signal profile in the time direction, and the minimum signal amplitude difference as a second minimum difference from the first signal profile in the signal amplitude direction.

18. The monitor of claim 16, wherein the identification signal generator is configured to establish the reference profile by one of:

adding the minimum time difference and the minimum signal amplitude difference to the first signal profile, and subtracting the minimum time difference and the minimum signal amplitude difference from the first signal profile.

19. A plasma process system comprising:

a power generator configured to supply power to a plasma process with a periodically changing output signal of the power generator as a plasma supply signal; and a plasma discharge monitor for monitoring a discharge in the plasma process, comprising:

a signal detector operable to:
    detect a first signal profile of the plasma supply signal in a first time range of a first time period of the plasma supply signal, and
    detect a second signal profile of the plasma supply signal in a second time range of a second time period of the plasma supply signal, points that the second time range is located in the second time period corresponding to points that the first time range is located in the first time period; and
an identification signal generator operable to:
    determine a threshold by carrying out a calculation from the first signal profile, a minimum time difference, and a minimum signal amplitude difference, such that the threshold has the minimum time difference in a time direction and the minimum signal amplitude difference in a signal amplitude direction, and
    generate an identification signal in response to determining that a difference between the first signal profile and the second signal profile is beyond the threshold, wherein the identification signal indicates a state or error in the plasma process.

20. The plasma process system of claim 19, wherein the power generator comprises one of
    a free-running mid-frequency generator and
    a bridge circuit for producing an alternating voltage.

21. The plasma process system of claim 19, wherein the signal detector is configured to measure a voltage at each of electrodes of the plasma process with a respective measurement data detector with respect to a reference earth.

22. A method of monitoring a discharge in a plasma process, the method comprising:
    detecting a first signal profile of a plasma supply signal in a first time range of a first time period of the plasma supply signal, the plasma supply signal being a periodically changing signal supplied to the plasma process;
    detecting a second signal profile of the plasma supply signal in a second time range of a second time period of the plasma supply signal, points that the second time range is located in the second time period corresponding to points that the first time range is located in the first time period;
    establishing a reference profile from the first signal profile based on a threshold by carrying out a calculation from the first signal profile, a minimum time difference, and a minimum signal amplitude difference, such that the reference profile has the minimum time difference as a first minimum difference from the first signal profile in a time direction and the minimum signal amplitude difference as a second minimum difference from the first signal profile in a signal amplitude direction;
    in response to determining that the second signal profile reaches the reference profile, determining that a difference between the first signal profile and the second signal profile is beyond the threshold; and
    in response to determining that the difference between the first signal profile and the second signal profile is beyond the threshold, generating an identification signal that indicates a state or error in the plasma process.

23. A method of monitoring a discharge in a plasma process, the method comprising:
    detecting a first signal profile of a plasma supply signal in a first time range of a first time period of the plasma supply signal, the plasma supply signal being a periodically changing signal supplied to the plasma process;
    detecting a second signal profile of the plasma supply signal in a second time range of a second time period of the plasma supply signal, points that the second time range is located in the second time period corresponding to points that the first time range is located in the first time period;
    selecting a plurality of selection points of the second signal profile;
    for each of the selection points, placing a respective geometric shape around the selection point, the respective geometric shape having a first dimension representing a minimum time difference in a time direction and a second dimension representing a minimum signal amplitude difference in a signal amplitude direction;
    comparing the second signal profile with the respective geometric shapes with the first signal profile;
    in response to determining that a portion of the first signal profile is outside of one of the respective geometric shapes, determining that a difference between the first signal profile and the second signal profile is beyond a threshold; and
    in response to determining that the difference between the first signal profile and the second signal profile is beyond the threshold, generating an identification signal that indicates a state or error in the plasma process.

24. A plasma discharge monitor for monitoring a discharge in a plasma process, the monitor comprising:
    a signal detector configured to receive a plasma supply signal that is a periodically changing signal supplied to the plasma process, the signal detector being operable to:
        detect a first signal profile of the plasma supply signal in a first time range of a first time period of the plasma supply signal, and
        detect a second signal profile of the plasma supply signal in a second time range of a second time period of the plasma supply signal, points that the second time range is located in the second time period corresponding to points that the first time range is located in the first time period; and
    an identification signal generator configured to:
        establish a reference profile from the first signal profile based on a threshold by carrying out a calculation from the first signal profile, a minimum time difference, and a minimum signal amplitude difference, such that the reference profile has the minimum time difference as a first minimum difference from the first signal profile in a time direction and the minimum signal amplitude difference as a second minimum difference from the first signal profile in a signal amplitude direction;
        determine that a difference between the first signal profile and the second signal profile is beyond the threshold in response to determining that the second signal profile reaches the reference profile; and
        generate an identification signal in response to determining that the difference between the first signal profile and the second signal profile is beyond the threshold, the identification signal indicating a state or error in the plasma process.

* * * * *